United States Patent
Kishimoto et al.

(10) Patent No.: US 11,404,667 B2
(45) Date of Patent: Aug. 2, 2022

(54) DISPLAY DEVICE AND METHOD FOR FABRICATING THE SAME

(71) Applicant: Samsung Display Co., Ltd., Yongin-si (KR)

(72) Inventors: Hirotsugu Kishimoto, Hwaseong-si (KR); Minju Kim, Suwon-si (KR); Munhwa Song, Hwaseong-si (KR); Dongmyung Shin, Hwaseong-si (KR); Yonghyuck Lee, Anyang-si (KR); Hyunju Lee, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 95 days.

(21) Appl. No.: 16/601,487

(22) Filed: Oct. 14, 2019

(65) Prior Publication Data

US 2020/0176710 A1    Jun. 4, 2020

(30) Foreign Application Priority Data

Nov. 30, 2018  (KR) .................. 10-2018-0151934

(51) Int. Cl.
*H01L 51/52* (2006.01)
*H01L 27/32* (2006.01)
(Continued)

(52) U.S. Cl.
CPC ...... *H01L 51/5253* (2013.01); *H01L 27/3244* (2013.01); *H01L 51/0097* (2013.01); *H01L 51/5293* (2013.01); *H01L 51/56* (2013.01)

(58) Field of Classification Search
CPC ............... H01L 51/529; H01L 51/5253; H01L 51/0097; H01L 27/3272; H01L 27/3276; H01L 27/3244; H01L 51/524; H01L 51/5293; H01L 51/56; H01L 51/5056; H01L 51/5092; H01L 51/5221; H01L 27/3246; H01L 51/5206; H01L 51/5072; H01L 27/3211; H01L 51/003; H01L 27/1262; H01L 24/32; H01L 27/1218;
(Continued)

(56) References Cited

U.S. PATENT DOCUMENTS 10,215,905 B2   2/2019  Nichol et al.
10,367,173 B1 * 7/2019  Wu .......................... G02B 1/14
(Continued)

FOREIGN PATENT DOCUMENTS

KR       10-0942298 B1    2/2010
KR    10-2010-0124019 A   11/2010
(Continued)

*Primary Examiner* — Mouloucoulaye Inoussa
(74) *Attorney, Agent, or Firm* — Lewis Roca Rothgerber Christie LLP

(57) ABSTRACT

A display device and a method of manufacturing the display device that is capable of easily bending the display device, simplifying manufacturing processes, and reducing manufacturing costs are provided. The display device includes a substrate including a bending area; a display element disposed on an upper surface of the substrate; and a protective layer disposed on a lower surface of the substrate. A portion of the protective layer that is disposed in the bending area has a material stiffness lower than a material stiffness of another portion of the protective layer.

6 Claims, 11 Drawing Sheets

(51) Int. Cl.
*H01L 51/00* (2006.01)
*H01L 51/56* (2006.01)

(58) Field of Classification Search
CPC ... H01L 27/124; H01L 24/229; Y02E 10/549; Y02P 70/50; G09G 3/3208; G09F 9/301; G06F 3/041; H05K 5/0017; H05K 5/03; H05K 1/144; H05K 3/46; H05K 1/028
USPC ............ 345/204; 361/749; 600/373; 606/41; 607/116
See application file for complete search history.

(56) References Cited

U.S. PATENT DOCUMENTS

| | | | |
|---|---|---|---|
| 2009/0102101 A1* | 4/2009 | Guilfoyle | C03C 17/324 |
| | | | 264/463 |
| 2016/0218305 A1* | 7/2016 | Kim | G02F 1/133345 |
| 2017/0145267 A1 | 5/2017 | Liu et al. | |
| 2017/0323779 A1* | 11/2017 | Um | H01L 27/1262 |
| 2018/0136371 A1* | 5/2018 | Kim | G06F 1/1603 |
| 2018/0166652 A1* | 6/2018 | Kim | B32B 3/30 |
| 2018/0168050 A1 | 6/2018 | Zhu | |
| 2019/0144714 A1* | 5/2019 | Hu | C09J 175/04 |
| | | | 428/174 |
| 2019/0173030 A1* | 6/2019 | Kim | B32B 17/10064 |
| 2020/0150481 A1* | 5/2020 | You | G02F 1/133308 |

FOREIGN PATENT DOCUMENTS

| | | |
|---|---|---|
| KR | 10-2018-0008700 A | 1/2018 |
| KR | 10-2018-0040509 A | 4/2018 |
| KR | 10-1939719 B1 | 1/2019 |

\* cited by examiner

DISPLAY DEVICE AND METHOD FOR FABRICATING THE SAME

CROSS-REFERENCE TO RELATED APPLICATION

This application claims priority to and the benefit of Korean Patent Application No. 10-2018-0151934, filed on Nov. 30, 2018, in the Korean Intellectual Property Office (KIPO), the disclosure of which is incorporated by reference herein in its entirety.

BACKGROUND

1. Field

One or more aspects of example embodiments of the present disclosure relate to a display device and a method of manufacturing the display device, and more particularly, to a display device and a method of manufacturing the display device that is capable of easily bending the display device, simplifying manufacturing processes, and reducing manufacturing costs.

2. Discussion of Related Art

In general, a substrate of a display device may have a bent shape in order to improve the visibility and thinness of the display device.

It is to be understood that this background of the technology section is intended to provide useful background for understanding the technology and may include ideas, concepts or recognitions that were not part of what was known or appreciated by those skilled in the pertinent art prior to the effective filing date of subject matter disclosed herein.

SUMMARY

Aspects of embodiments of the present disclosure are directed to a display device and a method of manufacturing the display device that is capable of easily bending the display device, simplifying manufacturing processes, and reducing manufacturing costs.

According to some embodiments, a display device includes a substrate including a bending area; a display element disposed on an upper surface of the substrate; and a protective layer disposed on a lower surface of the substrate. A portion of the protective layer that is disposed in the bending area has a material stiffness that is lower than a material stiffness of another portion of the protective layer (e.g., a non-bending area).

The protective layer may include a photo-curable material.

The photo-curable material may be a material that is curable by ultraviolet light.

Before the photo-curable material is cured, the photo-curable material may maintain a solid state at room temperature, and a material stiffness of the photo-curable material at a temperature ranging from about 50 degrees Celsius (° C.) to about 100° C. may be lower than a material stiffness of the photo-curable material in the solid state at room temperature.

The photo-curable material may include at least one of epoxy, acryl, and urethane.

The display device may further include an encapsulation layer on the display element; a polarizing member on the encapsulation layer; and a window on the polarizing member.

The display device may further include a module disposed on a lower surface of the protective layer.

According to some embodiments, a method of manufacturing a display device includes disposing (e.g., forming) a mother substrate on a carrier substrate; disposing (e.g., forming) a plurality of unit display parts on the mother substrate; disposing (e.g., forming) a protective layer on the plurality of unit display parts and the mother substrate; removing the carrier substrate; disposing (e.g., forming) a protective layer on a lower surface of the mother substrate; disposing (e.g., positioning) a mask on the protective layer so as to mask bending areas of the mother substrate (e.g., masking a portion or portions that are to be a bending area and not masking a portion or portions that are to be non-bending areas); and directing a light to be incident to the protective layer through the mask, and selectively curing a portion of the protective layer that is disposed on a portion of the mother substrate excluding the bending areas (e.g., selectively curing a portion or portions of the protective layer that are not masked and are to be a non-bending areas).

The method may further include cutting the protective layer, the mother substrate, and the protective layer for each unit display part.

The method may further include selectively applying heat to an uncured portion of the protective layer by irradiation with light.

The application of the heat to the uncured portion may include directing a laser beam to the uncured portion.

The process of disposing the protective layer on the lower surface of the mother substrate may include coating a raw material of the protective layer on the lower surface of the mother substrate.

The raw material of the protective layer may maintain a solid state at room temperature, and a material stiffness of the raw material at a temperature ranging from about 50° C. to about 100° C. may be lower than a material stiffness of the raw material in the solid state at room temperature.

The light used to cure the portion of the protective layer may include an ultraviolet light.

The foregoing is illustrative only and is not intended to be limiting.

BRIEF DESCRIPTION OF THE DRAWINGS

The above and other aspects and features of the present disclosure will become more apparent by describing in detail example embodiments thereof with reference to the accompanying drawings, wherein.

DETAILED DESCRIPTION

Figure 1:
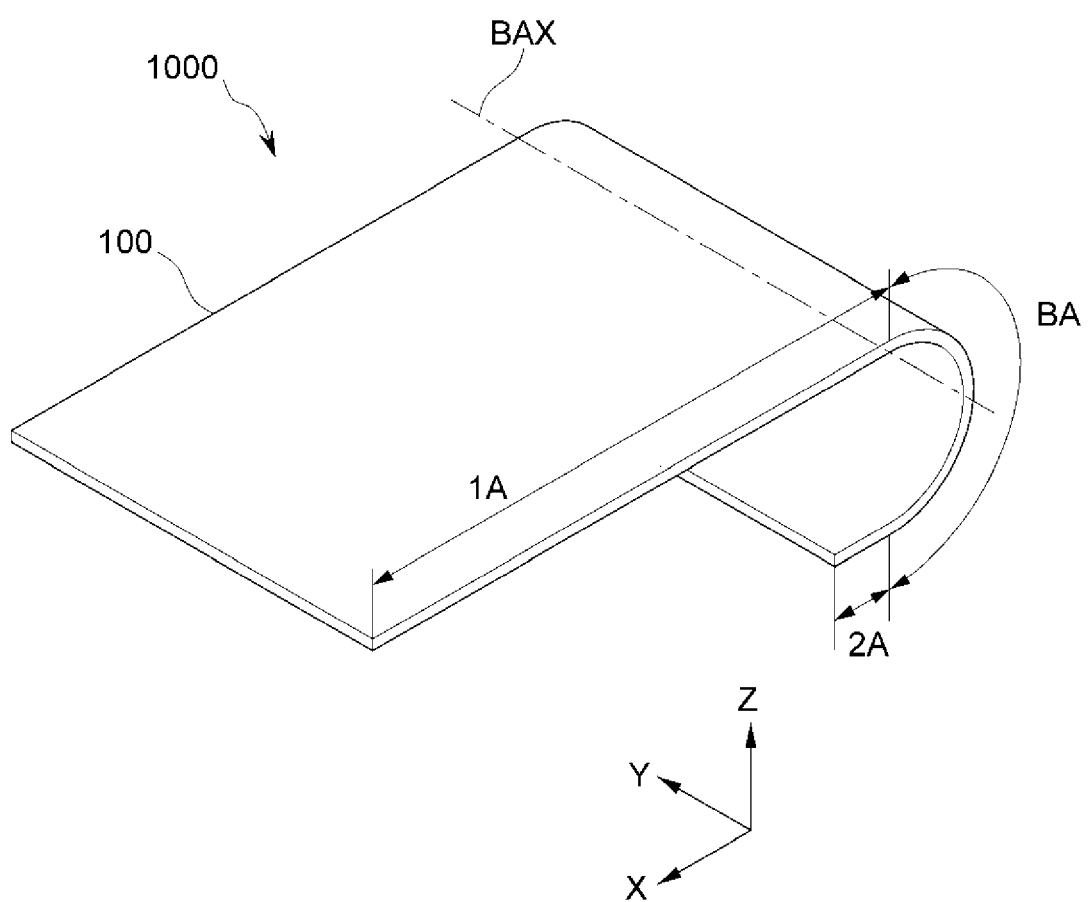
FIG. 1 is a perspective view illustrating a display device according to some example embodiments of the present disclosure.

Hereinafter, example embodiments will now be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

In the drawings, thicknesses of a plurality of layers and areas may be illustrated in an enlarged manner for clarity and ease of description thereof.

It will be further understood that the terms "comprises," "comprising," "includes" and/or "including," when used in this specification, specify the presence of stated features, integers, steps, operations, elements and/or components, but do not preclude the presence or addition of one or more other features, integers, steps, operations, elements, components and/or groups thereof.

It will be understood that when an area or element is referred to as being "on," "connected to," or "coupled to" another area or element, it may be directly on, connected, or coupled to the other area or element, or intervening areas or elements may be present therebetween. Conversely, when an area or element is referred to as being "directly on," "directly connected to," or "directly coupled to" another area or element, there are no intervening areas or elements therebetween. In addition, it will also be understood that when an area or element is referred to as being "between" two areas or elements, it can be the only area or element between the two areas or elements, or one or more intervening areas or elements may also be present.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

When a certain embodiment may be implemented differently, a specific process order may be performed differently from the described order. For example, two consecutively described processes may be performed substantially at the same time or performed in an order opposite to the described order.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Expressions such as "at least one of," when preceding a list of elements, modify the entire list of elements and do not only modify the individual elements of the list. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

As used herein, the terms "substantially," "about," "approximately" and similar terms are used as terms of approximation and not as terms of degree, and are intended to account for the inherent deviations in measured or calculated values that would be recognized by those of ordinary skill in the art. Further, these terms as used herein are inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Figure 2:
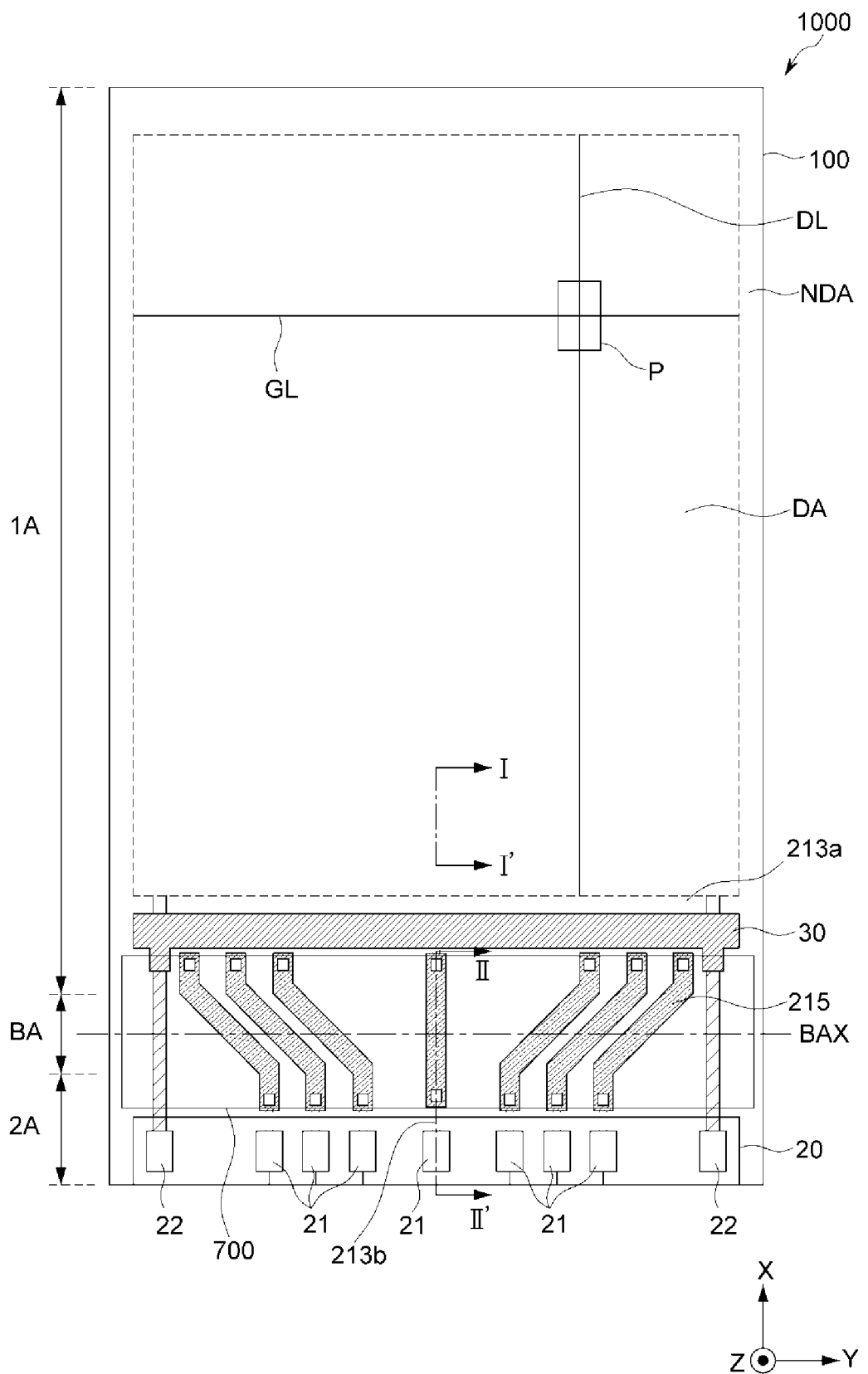
FIG. 2 is a plan view illustrating the display device of FIG. 1.

FIG. 1 is a perspective view illustrating a display device according to some example embodiments of the present disclosure, and FIG. 2 is a plan view illustrating the display device of FIG. 1.

A display device 1000 is illustrated in FIG. 1 and has a bent shape. For example, the display device 1000 according to some embodiments includes a substrate 100, and the substrate 100 may have a bent shape. However, in FIGS. 2 and 3 as described in more detail below, the display device is illustrated in a state or configuration that it is not bent for the convenience of describing certain aspects.

As illustrated in FIGS. 1 and 2, the substrate 100 may include a first area 1A, a second area 2A, and a bending area BA. In some embodiments, the first area 1A and the second area 2A are not bent. The bending area BA is disposed between the first area 1A and the second area 2A, and may connect the first area 1A to the second area 2A.

The first area 1A of the substrate 100 may have a quadrangular shape (e.g., when viewed in a plan or planar view).

The second area 2A of the substrate 100 may have a quadrangular shape (e.g., when viewed in a plan or planar view). In some embodiments, the second area 2A may have an area (e.g., surface area) that is less than an area (e.g., surface area) of the first area 1A (e.g., when viewed in a plan or planar view). For example, a width of the first area 1A and a width of the second area 2A may be substantially equal to each other, and a length of the first area 1A may be greater than a length of the second area 2A. As used herein, the width of the first and second areas 1A and 2A means the size of the first and second areas 1A and 2A in a Y-axis direction, and the length of the first and second areas 1A and 2A means the size of the first and second areas 1A and 2A in an X-axis direction, relative to the coordinates depicted in FIG. 1. A part or portion of the second area 2A of the substrate 100 in the bending state may overlap a part or portion of the first area 1A. For example, as illustrated in FIG. 1, the second area 2A may overlap the first area 1A in the Z-axis direction. In some embodiments, the second area 2A may be below the first area 1A, and may be spaced apart from the first area 1A.

The bending area BA of the substrate 100 may have a quadrangular shape that is bendable with respect to a bending axis BAX (see, e.g., FIG. 1). The bending axis BAX is parallel to the Y axis and may be located at the center of the bending area BA. The bending area BA of the substrate 100 may have a semicircular, U-shaped, or C-shaped cross-section, but is not limited thereto or thereby. The bending area BA may have an area (e.g., surface area) that is larger than that of the second area 2A and less than that of the first area 1A.

In some embodiments, the substrate 100 may be bent with a constant radius of curvature about the bending axis BAX. In other embodiments, however, the substrate 100 may be bent with a non-constant radius of curvature about the bending axis BAX.

As illustrated in FIG. 2, the first area 1A of the substrate 100 may include a display area DA where images are displayed, and a non-display area NDA where no image is displayed. The non-display area NDA may be located at an edge of the first area 1A (e.g., one or more edges). In some embodiments, the non-display area NDA may have a shape that surrounds the display area DA.

The bending area BA and the second area 2A may correspond to the above-described non-display area NDA. Accordingly, the non-display area NDA may include a part or portion of the first area 1A other than the display area DA, the bending area BA, and the second area 2A.

A plurality of pixels P for displaying images, a gate line GL for transmitting a gate signal, a data line DL for transmitting a data signal, a driving power line 30 for transmitting a driving power, and a common power line for transmitting a common voltage may be disposed in the display area DA.

The plurality of pixels P may be disposed on the substrate 100 in various patterns, for example, a stripe pattern and a PenTile pattern, but is not limited thereto or thereby.

The pixel P is electrically connected to the gate line GL, the data line DL, the driving power line 30 and the common power line. The pixel P may include elements, for example, a switching element, a display element, and a capacitor. The switching element may be a thin film transistor. The display element may be a light emitting diode ("LED"), for example, an organic light emitting diode ("OLED").

The pixel P is activated in accordance with the gate signal from the gate line GL. The switching element of the pixel P generates a driving current having a magnitude corresponding to the data signal from the data line DL, the driving voltage from the driving power line 30, and the common voltage from the common power line. The driving current is applied to the display element (e.g., an LED). The display element emits light at a luminance corresponding to the magnitude of the driving current.

The gate line GL, the data line DL, the driving power line 30 and the common power line described above are connected to a terminal portion 20 through a connection line 215 (e.g., one or more connection lines 215) disposed in the non-display area NDA.

The terminal portion 20 may be disposed in the second area 2A. The terminal portion 20 may include a plurality of terminals 21 and 22. The terminal portion 20 may be exposed to an outside of the display device 1000 without being covered by an insulating layer.

The terminal portion 20 may be connected to a driving circuit portion 900, such that the gate line GL, the data line DL, the driving power line 30 and the common power line described above are connected to the driving circuit portion 900 through the connection line 215 and the terminal portion 20.

The driving circuit portion 900 provides, for example, the gate signal, the data signal, the driving voltage, and the common voltage. The driving circuit portion 900 may be, for example, an integrated circuit (IC) or a circuit board. In such an embodiment, the circuit board may be a flexible printed circuit board (FPCB).

The driving power line 30 may be connected to the driving circuit portion 900 through a driving terminal 22. The driving power line 30 may provide the driving voltage from the driving circuit portion 900 to the pixels P. The driving power line 30 may be disposed in the non-display area NDA. In some embodiments, the connection lines 215 for applying the data signal or the gate signal to the pixels P intersect the driving power line 30. In some embodiments, the connection lines 215 may be connected to lines of another layer through a contact hole.

Hereinafter, a vertical structure of the display device according to some embodiments will be described with reference to FIG. 3.

Figure 3:
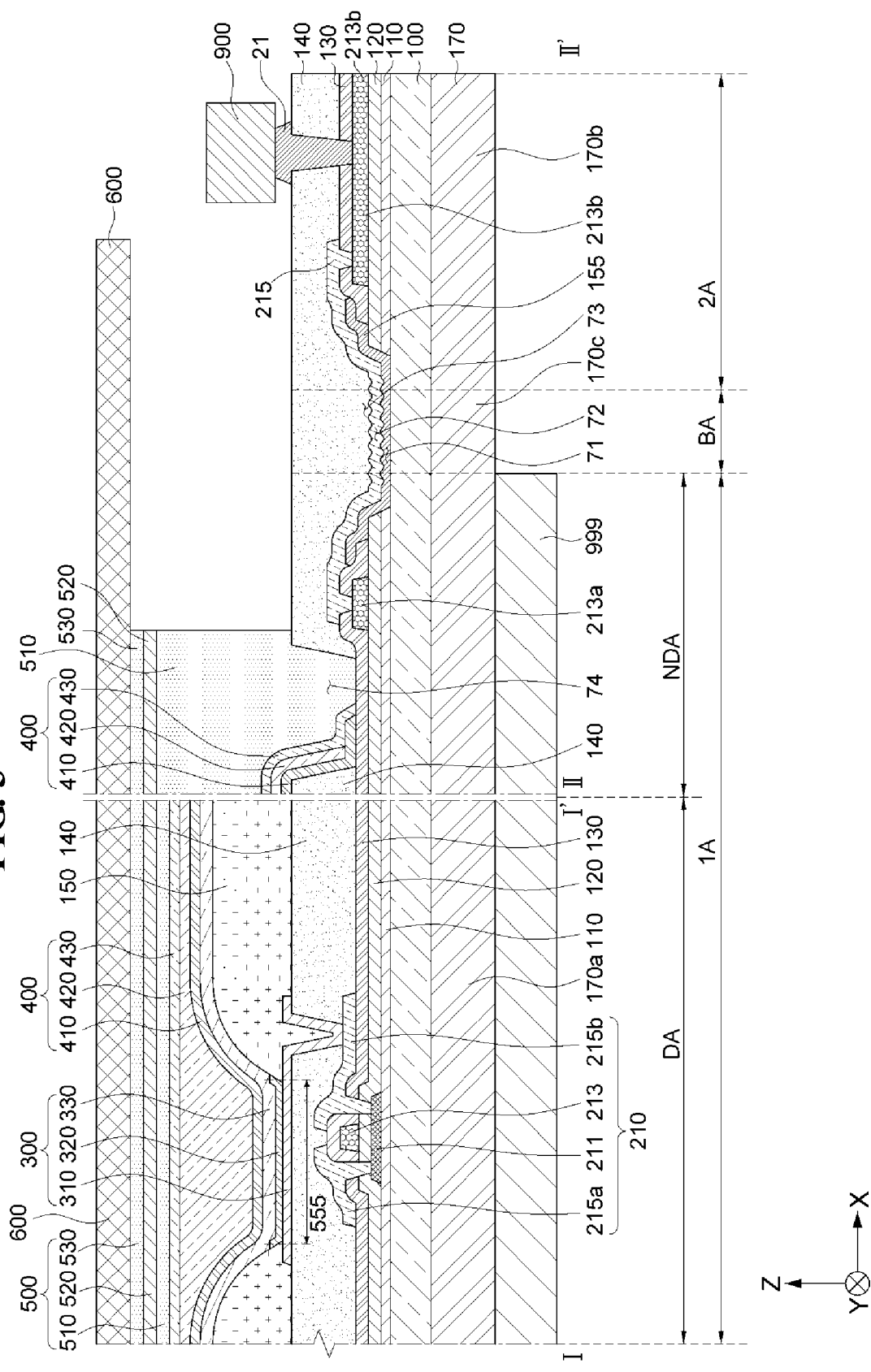
FIG. 3 is a cross-sectional view taken along lines I-I' and II-II' in FIG. 2.
Figure 4:
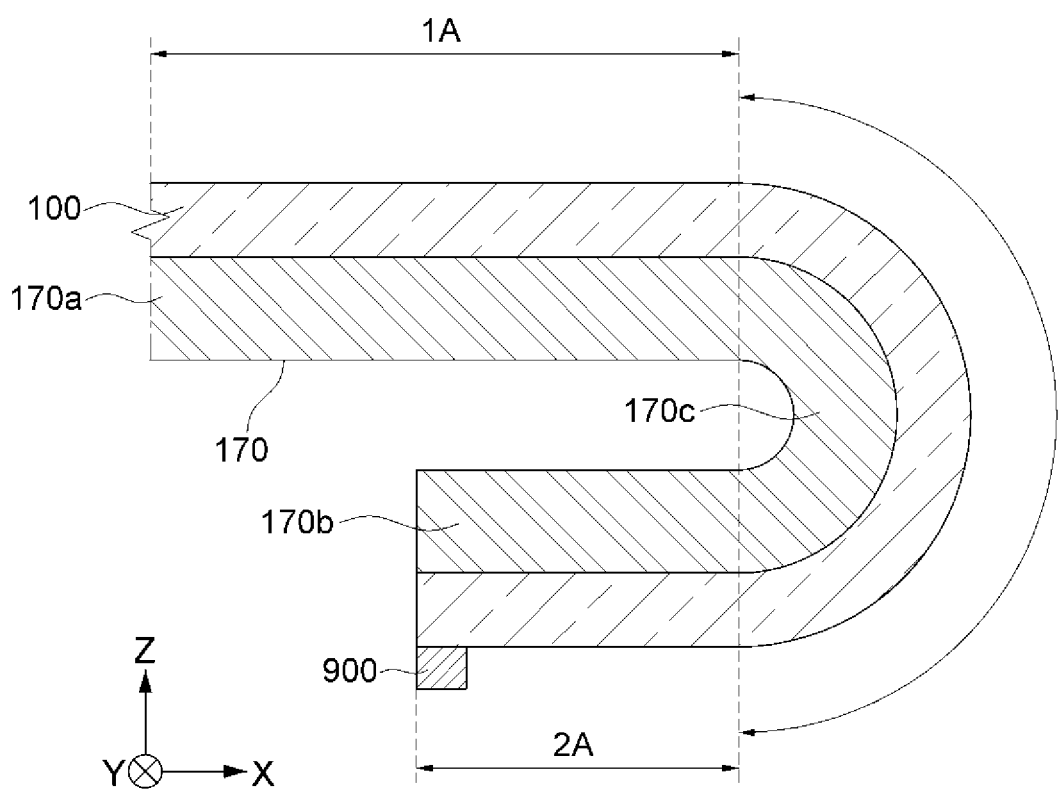
FIG. 4 is a view illustrating a bent shape of a substrate and a protective layer of FIG. 3.

FIG. 3 is a cross-sectional view taken along lines I-I' and II-II' in FIG. 2, and FIG. 4 is a view illustrating a bent shape of a substrate and a protective layer of FIG. 3.

As illustrated in FIGS. 3 and 4, the display device 1000 includes a protective layer 170, a substrate 100, a buffer layer 110, a switching element 210, a gate insulating layer 120, a first conductive layer 213a, a second conductive layer 213b, an insulating interlayer 130, an organic layer 155, a connection line 215, a planarization layer 140, a display element 300, a pixel defining layer 150, an encapsulation layer 400, a polarizing member 500, a window 600, and a module 999.

First, as illustrated in FIG. 3, the substrate 100 includes two surfaces that are opposite to each other in the Z-axis direction. The surface that is closer to the polarizing member 500 is defined as an upper surface of the substrate 100, and the surface that is farther to the polarizing member 500 is defined as a lower surface of the substrate 100.

The protective layer 170 is disposed on the lower surface of the substrate 100. In some embodiments, the protective layer 170 may be disposed directly on the lower surface of the substrate 100. In addition, the protective layer 170 may contact the lower surface of the substrate 100. A portion of the protective layer 170 that is disposed in the bending area BA of the substrate 100 may have lower material stiffness (e.g., greater flexibility) than that of another portion of the protective layer 170 (e.g., with a lower elastic modulus or Young's modulus). For example, the protective layer 170 may include a first protection portion 170a disposed in the first area 1A of the substrate 100, a second protection portion 170b disposed in the second area 2A of the substrate 100, and a third protection portion 170c disposed in the bending area BA of the substrate 100. In some embodiments, a material stiffness of the third protection portion 170c may be lower than a material stiffness of the first protection portion 170a and/or lower than a material stiffness of the second protection portion 170b (e.g., the third protection portion 170c may have a lower elastic modulus or Young's modulus). In some embodiments, the material stiffness of the first protection portion 170a and the material stiffness of the second protection portion 170b may be substantially equal to each other. The first, second, and third protection portions 170a, 170b, and 170c may be integrally formed into a unitary structure. Further, the first, second, and third protection portions 170a, 170b, and 170c may have the same cross-sectional shape prior to bending (e.g., in the YZ plane shown in FIG. 1).

The protective layer 170 may include a photo-curable material. For example, the protective layer 170 may include a photo-curable material that may be cured by ultraviolet (UV) light. The photo-curable material before curing maintains a solid state at room temperature (for example, 25 degrees Celsius (° C.)). In addition, before curing, a material stiffness of the photo-curable material at a temperature ranging from about 50° C. to about 100° C. may be lower than a material stiffness of the photo-curable material in the above-described solid state at room temperature. For example, the photo-curable material may include at least one of epoxy, acryl, and urethane.

The first protection portion 170a and the second protection portion 170b of the protective layer 170 may include a photo-curable material that is cured by light (e.g., UV light), and the third protection portion 170c may include a photo-curable material that is not cured. Accordingly, the material stiffness of the third protection portion 170c is lower than the material stiffness of the first protection portion 170a (and/or the material stiffness of the second protection portion 170b). For example, the third protection portion 170c may have a lower elastic modulus or Young's modulus than the first protection portion 170a and/or the second protection portion 170b.

The substrate 100 is disposed on the protective layer 170. For example, the substrate 100 is positioned between the protective layer 170 and the buffer layer 110. The substrate 100 may include various materials having flexible or bendable characteristics. For example, the substrate 100 may include a polymer resin such as polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC) and/or cellulose acetate propionate (CAP). The substrate 100 may have a single-layer or multi-layer structure including the above-mentioned materials, and in the case of a multi-layer structure, the substrate 100 may further include an inorganic layer in addition to the above-mentioned materials.

The buffer layer 110 is disposed on the substrate 100. The buffer layer 110 may enhance the flatness of the upper surface of the substrate 100, or may substantially prevent or minimize impurities from, for example, the substrate 100 from penetrating into a semiconductor layer 211. The buffer layer 110 may have an opening 71. The opening 71 of the buffer layer 110 overlaps the third protection portion 170c of the protective layer 170. In other words, the opening 71 of the buffer layer 110 is located in an region corresponding to the third protection portion 170c of the protective layer 170. The opening 71 of the buffer layer 110 may be larger than the third protection portion 170c of the protective layer 170 (e.g., may have a greater width when viewed in a cross-sectional view such as in FIG. 3). The buffer layer 110 may include at least one inorganic material such as silicon oxide, silicon nitride, and silicon oxynitride. The buffer layer 110 may be omitted in some embodiments.

The switching element 210 is disposed on the buffer layer 110 in the first area 1A. For example, the switching element 210 is disposed on the buffer layer 110 in the display area DA of the first area 1A. The switching element 210 may include a semiconductor layer 211, a gate electrode 213, a source electrode 215a, and a drain electrode 215b.

The semiconductor layer 211 is disposed on the buffer layer 110 in the first area 1A. For example, the semiconductor layer 211 may be disposed on the buffer layer 110 in the display area DA of the first area 1A. The semiconductor layer 211 may include at least one of the following: a polycrystalline silicon layer, an amorphous silicon layer and an oxide semiconductor including, for example, indium gallium zinc oxide (IGZO) or indium zinc tin oxide (IZTO). For example, when the semiconductor layer 211 includes a polycrystalline silicon layer, the semiconductor layer 211 may include a channel area which is not doped with impurities and p+ doped source and drain areas which are formed on opposite sides of the channel area. In some embodiments, p-type impurities, such as boron B, may be used as dopant ions and $B_2H_6$ may be used. Such impurities may vary depending on the type of switching elements used.

The gate insulating layer 120 is disposed on the semiconductor layer 211 and the buffer layer 110. The gate insulating layer 120 may have an opening 72. The opening 72 of the gate insulating layer 120 overlaps the third protection portion 170c of the protective layer 170 described above. In other words, the opening 72 of the gate insulating layer 120 is positioned in a region corresponding to the third protection portion 170c of the protective layer 170. The opening 72 of the gate insulating layer 120 may be larger than the third protection portion 170c of the protective layer 170 and larger than the opening 71 of the buffer layer 110 (e.g., may have a greater width when viewed in a cross-sectional view such as in FIG. 3). The gate insulating layer 120 may include at least one of: tetraethyl orthosilicate (TEOS), silicon nitride ($SiN_x$) and silicon oxide ($SiO_2$). For example, the gate insulating layer 120 may have a double-layer structure where a $SiN_x$ layer having a thickness of about 40 nm and a TEOS layer having a thickness of about 80 nm are sequentially stacked.

The gate electrode 213 is disposed on the gate insulating layer 120 in the first area 1A. For example, the gate electrode 213 is disposed on the gate insulating layer 120 in the display area DA of the first area 1A. The gate electrode 213 overlaps a portion of the semiconductor layer 211. For example, the gate electrode 213 is disposed on the gate insulating layer 120 so as to overlap the channel area of the semiconductor layer 211. The gate electrode 213 serves to substantially prevent impurities from being doped into the channel area when the impurity is doped in the source area and the drain area of the semiconductor layer 211 in the process of forming the semiconductor layer 211. The gate electrode 213 may include at least one of molybdenum (Mo), chromium (Cr) and tungsten (W).

The first conductive layer 213a is disposed on the gate insulating layer 120 in the first area 1A. For example, the first conductive layer 213a is disposed on the gate insulating layer 120 in the non-display area NDA of the first area 1A. The first conductive layer 213a may be connected to the switching element 210. The first conductive layer 213a may include a material that is substantially the same as the material included in the gate electrode 213 described above.

The second conductive layer 213b is disposed on the gate insulating layer 120 in the second area 2A. The second conductive layer 213b may include a material that is substantially the same as the material included in the gate electrode 213 described above.

The insulating interlayer 130 is disposed on the gate electrode 213, the first conductive layer 213a, the second conductive layer 213b, and the gate insulating layer 120. The insulating interlayer 130 may have an opening 73. The opening 73 of the insulating interlayer 130 overlaps the third protection portion 170c of the protective layer 170 described above. In other words, the opening 73 of the insulating interlayer 130 is positioned in a region corresponding to the third protection portion 170c of the protective layer 170. The opening 73 of the insulating interlayer 130 may be larger than the third protection portion 170c of the protective layer 170, larger than the opening 71 of the buffer layer 110, and larger than the opening 72 of the gate insulating layer 120 (e.g., may have a greater width when viewed in a cross-sectional view such as in FIG. 3). The insulating interlayer 130 may include a material that is substantially the same as the material included in the gate insulating layer 120.

The organic layer 155 is disposed in the non-display area NDA of the first area 1A, the bending area BA, and the second area 2A. For example, the organic layer 155 is disposed in the opening 71 of the buffer layer 110, the opening 72 of the gate insulating layer 120, and the opening 73 of the insulating interlayer 130. A part or portion of the organic layer 155 is disposed on a portion of the upper surface of the substrate 100 that is exposed by the opening 71 of the buffer layer 110.

The source electrode 215a and the drain electrode 215b are disposed on the insulating interlayer 130 in the first area 1A. For example, the source electrode 215a and the drain electrode 215b are disposed on the insulating interlayer 130 in the display area DA of the first area 1A. The source electrode 215a is connected to the source area of the semiconductor layer 211 through a source contact hole defined through the insulating interlayer 130 and the gate insulating layer 120, and the drain electrode 215b is connected to the drain area of the semiconductor layer 211 through a drain contact hole defined through the insulating interlayer 130 and the gate insulating layer 120. The source electrode 215a may include or be formed of a refractory metal, e.g., molybdenum, chromium, tantalum, and titanium, and/or an alloy thereof. The source electrode 215a may have a multilayer structure including a refractory metal layer and a low resistance conductive layer. Examples of the multilayer structure may include: a double-layer structure including a chromium or molybdenum lower layer (or alloy thereof) and an aluminum upper layer (or alloy thereof); and a triple-layer structure including a molybdenum lower layer (or alloy thereof), an aluminum intermediate layer (or alloy thereof), and a molybdenum upper layer (or alloy thereof). In some embodiments, the source electrode 215a may include or be formed of any suitable metals and/or conductors rather than the aforementioned materials. The drain electrode 215b and the source electrode 215a may include substantially the same material and have substantially the same structure.

The connection line 215 is disposed on the insulating interlayer 130 and the organic layer 155 in the first area 1A (e.g., in the non-display area NDA), in the bending area BA, and in the second area 2A. The connection line 215 is connected to each of the first conductive layer 213a and the second conductive layer 213b through contact holes defined through the insulating interlayer 130. In other words, the connection line 215 electrically connects the first conductive layer 213a and the second conductive layer 213b to each other. The connection line 215 and the source electrode 215a may include substantially the same material and have substantially the same structure.

The planarization layer 140 is disposed on the source electrode 215a, the drain electrode 215b, the connection line 215, and the insulating interlayer 130. The planarization layer 140 eliminates a height difference between components disposed between the planarization layer 140 and the substrate 100 to provide a flat surface. The luminous efficiency of the display element 300 may be improved by the planarization layer 140. The planarization layer 140 has an opening 74 in the non-display area NDA of the first area 1A. The insulating interlayer 130 is exposed by the opening 74 of the planarization layer 140. The planarization layer 140 may include at least one of: a polyacrylate resin, an epoxy resin, a phenolic resin, a polyamide resin, a polyimide resin, an unsaturated polyester resin, a polyphenylene ether resin, a polyphenylene sulfide resin, and benzocyclobutene (BCB).

The display element 300 is disposed on the planarization layer 140 in the first area 1A. For example, the display element 300 is disposed on the planarization layer 140 in the display area DA of the first area 1A. The display element 300 includes a first electrode 310 (hereinafter, "a pixel electrode"), a light emitting layer 320, and a second electrode 330 (hereinafter, "a common electrode").

The pixel electrode 310 is disposed on the planarization layer 140 in the first area 1A. For example, the pixel electrode 310 is disposed on the planarization layer 140 in the display area DA of the first area 1A. The pixel electrode 310 is connected to the drain electrode 215b through a contact hole of the planarization layer 140. A portion or an entirety of the pixel electrode 310 may disposed in a pixel area 555. That is, the pixel electrode 310 may be disposed in the pixel area 555 that is defined by the pixel defining layer 150.

The pixel defining layer 150 is disposed on the planarization layer 140 in the first area 1A. In addition, the pixel defining layer 150 may be further disposed on an edge of the pixel electrode 310. The pixel area 555 defined by the pixel defining layer 150 is located in the display area DA of the first area 1A. The pixel defining layer 150 may include a resin, e.g., a polyacrylate resin and/or a polyimide resin.

A light emitting layer 320 is disposed on the pixel electrode 310 in the pixel area 555. The light emitting layer 320 is positioned between the pixel electrode 310 and the common electrode 330. The light emitting layer 320 may include a low molecular weight organic material or a high molecular weight organic material. At least one of a hole injection layer HIL and a hole transporting layer HTL may further be disposed between the pixel electrode 310 and the light emitting layer 320, and at least one of an electron transporting layer ETL and an electron injection layer EIL may further be disposed between the light emitting layer 320 and the common electrode 330.

The common electrode 330 is disposed on the light emitting layer 320 and the pixel defining layer 150. The common electrode 330 may be located in the first area 1A. The common electrode 330 is connected to the aforementioned common power line.

The pixel electrode 310 and the common electrode 330 may be formed as one of a transmissive electrode, a transflective electrode, and a reflective electrode. A transparent conductive oxide (TCO) may be used to form the pixel electrode 310 and the common electrode 330. In some embodiments, the TCO may include at least one of: indium tin oxide (ITO), indium zinc oxide (IZO), antimony tin oxide (ATO), aluminum zinc oxide (AZO), zinc oxide (ZnO), and mixtures thereof. In order to form the transflective electrode and the reflective electrode, metal, e.g., magnesium (Mg), silver (Ag), gold (Au), calcium (Ca), lithium (Li), chromium (Cr), aluminum (Al) and copper (Cu), or an alloy thereof may be used. In some embodiments, whether an electrode is a transflective type or a reflective type may depend on the thickness of the electrode. In some embodiments, the transflective electrode has a thickness of about 200 nm or less, and the reflective electrode has a thickness of about 300 nm or more. As the thickness of the transflective electrode decreases, light transmittance and resistance increase. Conversely, as the thickness of the transflective electrode increases, light transmittance decreases. In addition, the transflective electrode and the reflective electrode may have a multilayer structure which includes a metal layer including a metal or a metal alloy, and a TCO layer stacked on the metal layer.

The encapsulation layer 400 is disposed on the common electrode 330. The encapsulation layer 400 may be located in the first area 1A. The encapsulation layer 400 may be a transparent insulating substrate including, for example, glass and/or transparent plastic. In addition, the encapsulation layer 400 may have a thin-film encapsulation structure in which at least one inorganic layer and at least one organic layer are alternately stacked. For example, the encapsulation layer 400 may include a first inorganic layer 410, an organic layer 420 on the first inorganic layer 410, and a second inorganic layer 430 on the organic layer 420. In the non-display area NDA of the first area 1A, the first inorganic layer 410 and the second inorganic layer 430 of the encapsulation layer 400 contact the insulating interlayer 130 through the opening 74 of the planarization layer 140. In addition, in the non-display area NDA of the first area 1A, an end portion of the first inorganic layer 410 and an end portion of the second inorganic layer 430 contact each other.

The polarizing member 500 is disposed on the encapsulation layer 400. The polarizing member 500 may be located in the first area 1A. The polarizing member 500 includes a first adhesive layer 510, a polarizing plate 520, and a second adhesive layer 530.

The first adhesive layer 510 is disposed on the second inorganic layer 430 of the encapsulation layer 400, the insulating interlayer 130, and the planarization layer 140. The first adhesive layer 510 in the non-display area NDA is disposed on the planarization layer 140 and in the opening 74 of the planarization layer 140. The first adhesive layer 510 of the non-display area NDA has a thickness greater than a thickness of the first adhesive layer 510 of the display area DA. As used herein, the thickness of the first adhesive layer 510 means the size of the first adhesive layer 510 in the Z-axis direction. The first adhesive layer 510 may be an optically clear adhesive (OCA). The polarizing plate 520 may be attached to the encapsulation layer 400 by the first adhesive layer 510.

The polarizing plate 520 is disposed on the first adhesive layer 510. The polarizing plate 520 may be disposed between the first adhesive layer 510 and the second adhesive layer 530. The polarizing plate 520 may reduce reflection of external light. For example, external light that passes through the polarizing plate 520 undergoes a phase change. After passing through the polarizing plate 520, the external light becomes incident to the common electrode 330, and is then reflected from the common electrode 330 toward the polarizing plate 520 again. However, since the external light underwent a phase change when it first passed through the polarizing plate 520, such phase-changed external light may not pass through the polarizing plate 520 again. In other words, the light reflected from the common electrode 330 may not pass through the polarizing plate 520. Accordingly, the reflectance of the external light may be reduced and the image quality may be improved.

The second adhesive layer 530 is disposed on the polarizing plate 520. The second adhesive layer 530 may be disposed between the polarizing plate 520 and the window 600. The second adhesive layer 530 may be made of the aforementioned optically clear adhesive. The window 600 may be attached to the polarizing plate 520 by the second adhesive layer 530.

The window 600 is disposed on the second adhesive layer 530. The window 600 has an opening that is positioned in a region corresponding to the display area DA of the first area 1A.

The module is disposed on a lower surface of the protective layer 170. The module may contact the protective layer 170. The module may include, for example, a cushion layer, a heat dissipation layer, and/or a digitizer. The cushion layer serves to mitigate impact applied to the display device 1000. The heat dissipation layer serves to discharge internal heat of the display device 1000 to the outside (e.g., an exterior of the display device 1000). The digitizer is a device that receives a touch input from an input tool such as a digital pen.

In some embodiments (not illustrated), an adhesive layer may be further disposed between the module and the protective layer 170. This adhesive layer may bond the module and the protective layer 170 to each other.

FIGS. 5A to 5K are cross-sectional views illustrating a method of manufacturing a display device according to some embodiments.

Figure 5A:
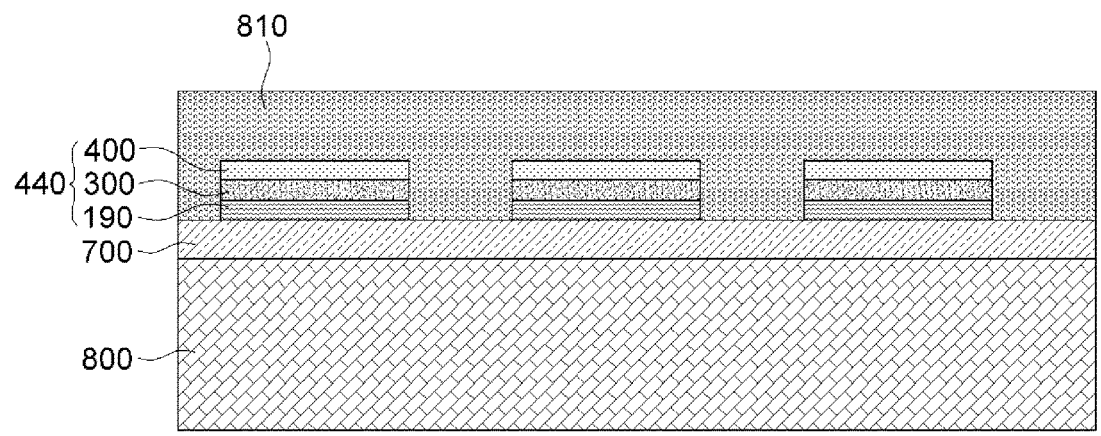
FIGS. 5A to 5K are cross-sectional views illustrating a method of manufacturing a display device according to some example embodiments of the present disclosure.

First, as illustrated in FIG. 5A, a mother substrate 700 is disposed on a carrier substrate 800. Next, a plurality of unit display parts 440 are disposed on the mother substrate 700. Each of the unit display parts 440 includes a driving element layer 190, the display element 300, and the encapsulation layer 400. Herein, the driving element layer 190 may include the buffer layer 110, the switching element 210, the gate insulating layer 120, the first conductive layer 213*a*, the second conductive layer 213*b*, the insulating interlayer 130, the organic layer 155, the connection line 215, the planarization layer 140, and the pixel defining layer 150.

The carrier substrate 800 may include a glass material. A material stiffness of the carrier substrate 800 is higher than a material stiffness of the mother substrate 700.

In addition, as illustrated in FIG. 5A, a protective layer 810 is disposed (e.g., formed or positioned) on the unit display parts 440 and the mother substrate 700.

Figure 5B:
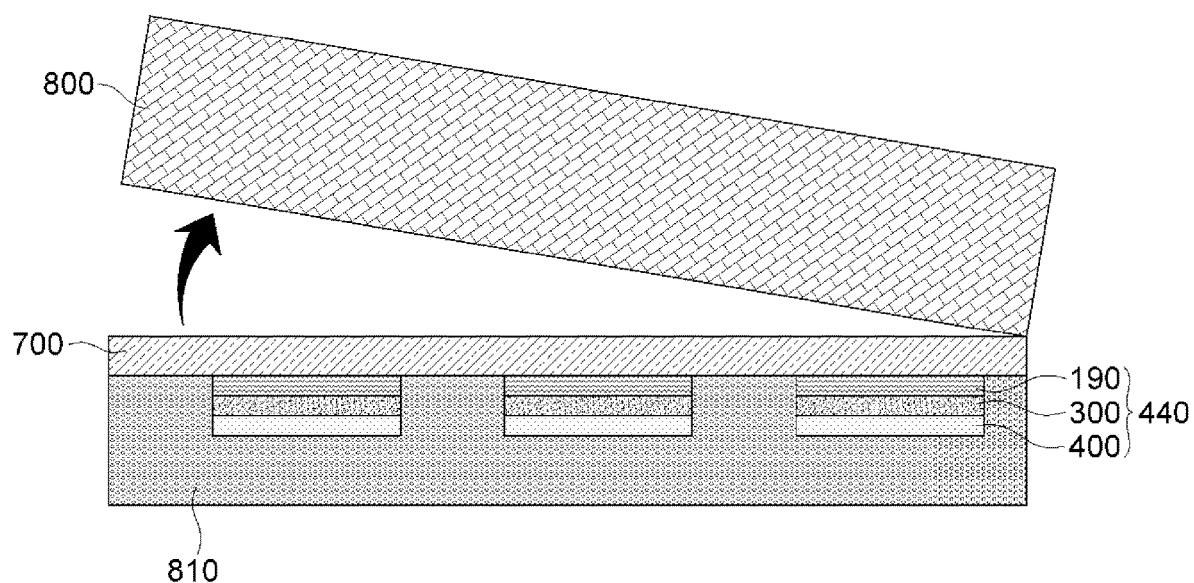

Then, as illustrated in FIG. 5B, the structure illustrated in FIG. 5A is rotated 180 degrees, such that the carrier substrate 800 is disposed on an upper side, and the protective layer 810 is disposed on a lower side (e.g., the protective layer 810 is below the carrier substrate 800). Next, the carrier substrate 800 is removed from the structure. For example, the carrier substrate 800 is separated from the mother substrate 700.

Figure 5C:
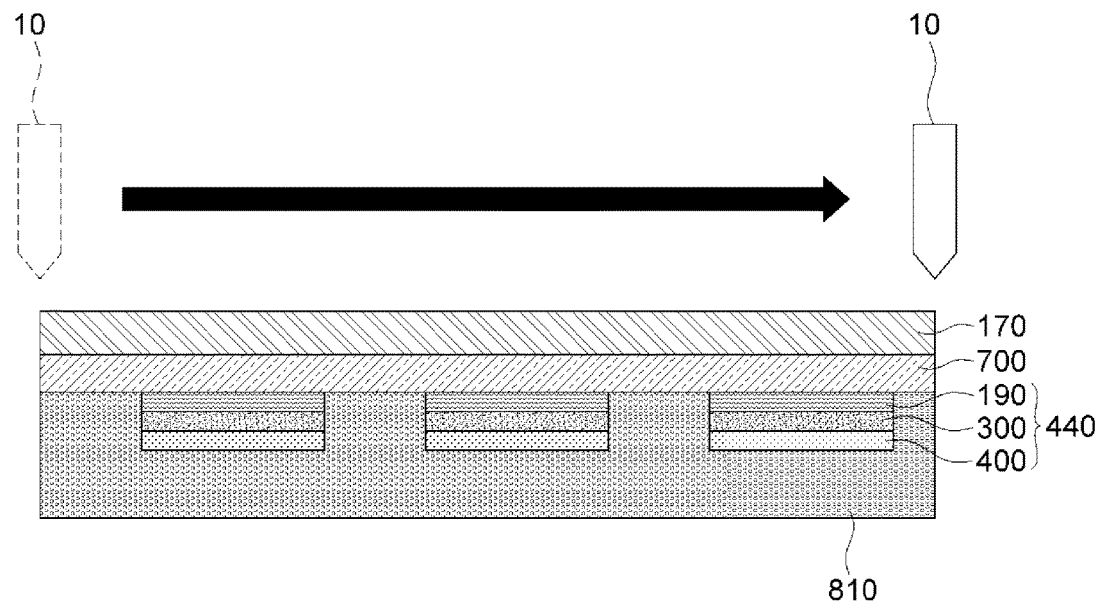

Next, as illustrated in FIG. 5C, the protective layer 170 is disposed (e.g., formed or positioned) on the mother substrate 700. For example, a raw material of the protective layer 170 discharged from a coating apparatus 10 is coated over an exposed surface of the mother substrate 700. For example, as the coating apparatus 10 moves in a direction of the arrow illustrated in FIG. 5C while discharging the raw material of the protective layer 170, the raw material of the protective layer 170 from the coating apparatus 10 may be coated over an entire surface of the mother substrate 700. The raw material of the protective layer 170 may include a liquid at a temperature ranging from about 50° C. to about 100° C. In some embodiments, the protective layer 170 maintains a state substantially close to a liquid at a temperature ranging from about 60° C. to about 80° C. The raw material of the protective layer 170 may include a photo-curable material. The photo-curable material may include at least one of epoxy, acryl and urethane.

Figure 5D:
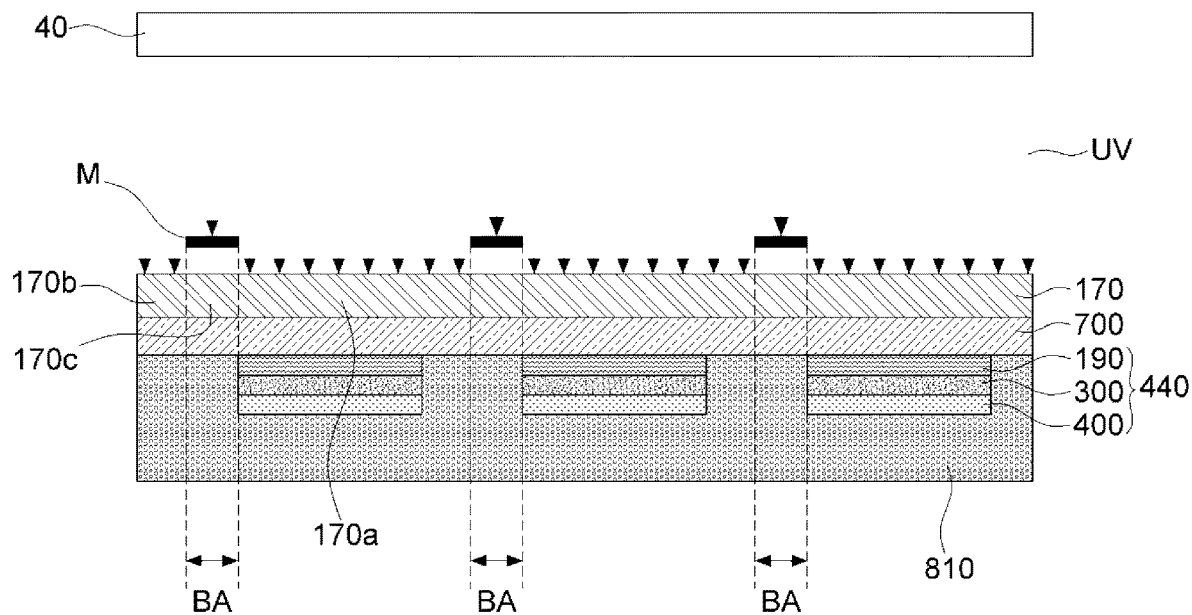

Next, as illustrated in FIG. 5D, a mask M that selectively masks only the bending area BA of the mother substrate 700 is disposed (e.g., positioned) on the protective layer 170. Accordingly, the third protection portion 170*c* of the protective layer 170 is covered by the mask. Then, a light irradiation apparatus 40 is disposed on (or above) the mask. A light, for example, a UV light, from the light irradiation apparatus 40 is directed in a selective manner to be incident to the first protection portion 170*a* and the second protection portion 170*b* of the protective layer 170 (e.g., and not incident to the third protection portion 170*c*). That is, the light may be incident to a remaining portion of the protective layer 170 excluding the third protection portion 170*c* (e.g., an entirety of the protective layer 170 excluding the third protective portion 170*c*). Accordingly, the first protection portion 170*a* and the second protection portion 170*b* of the protective layer 170 are cured, and the third protection portion 170*c* of the protective layer 170 is not cured.

Accordingly, the material stiffness of the third protection portion 170*c* is lower than the material stiffness of the first protection portion 170*a* and/or the material stiffness of the second protection portion 170*b* (e.g., the third protection portion 170*c* may have a lower elastic modulus or Young's modulus).

Figure 5E:
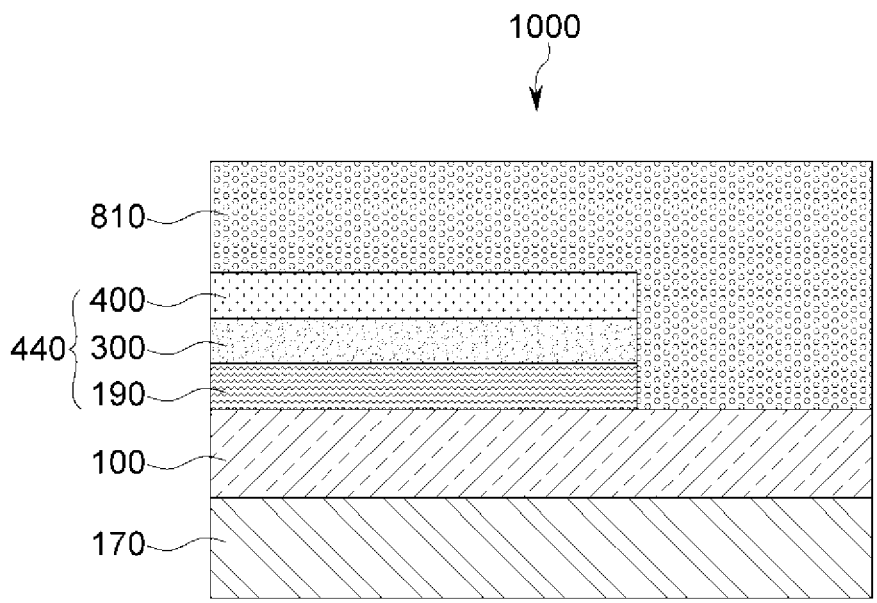

Next, the structure of FIG. 5D is inverted by 180 degrees, and the protective s layer 170, the mother substrate 700, and the protective layer 810 are cut for each unit display part 440. FIG. 5E shows one display device 1000 that includes one unit display part 440.

As illustrated in FIG. 5E, one display device 1000 includes the protective layer 170, the substrate 100, the unit display part 440, and the protective layer 810.

Figure 5F:
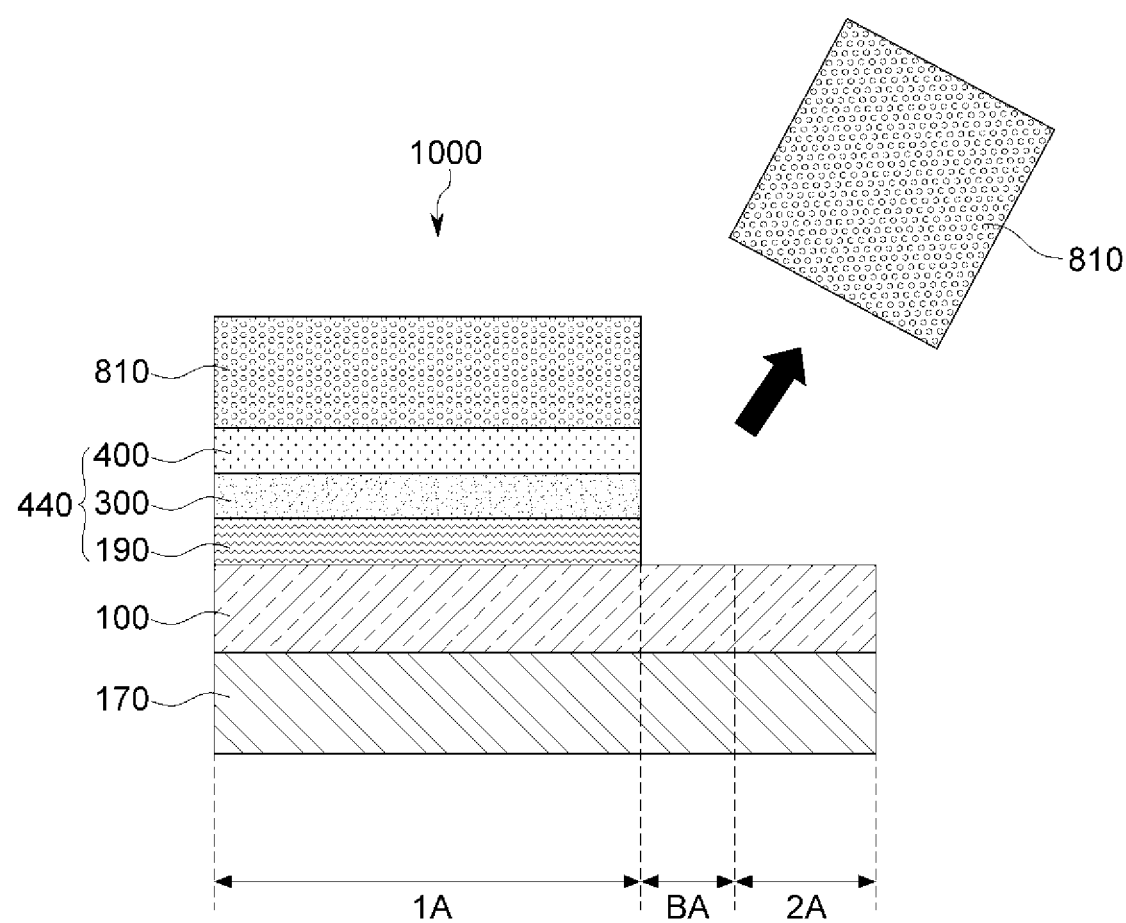

Next, as illustrated in FIG. 5F, the protective layer 810 disposed in the second area 2A and the bending area BA of the substrate 100 is removed.

Figure 5G:
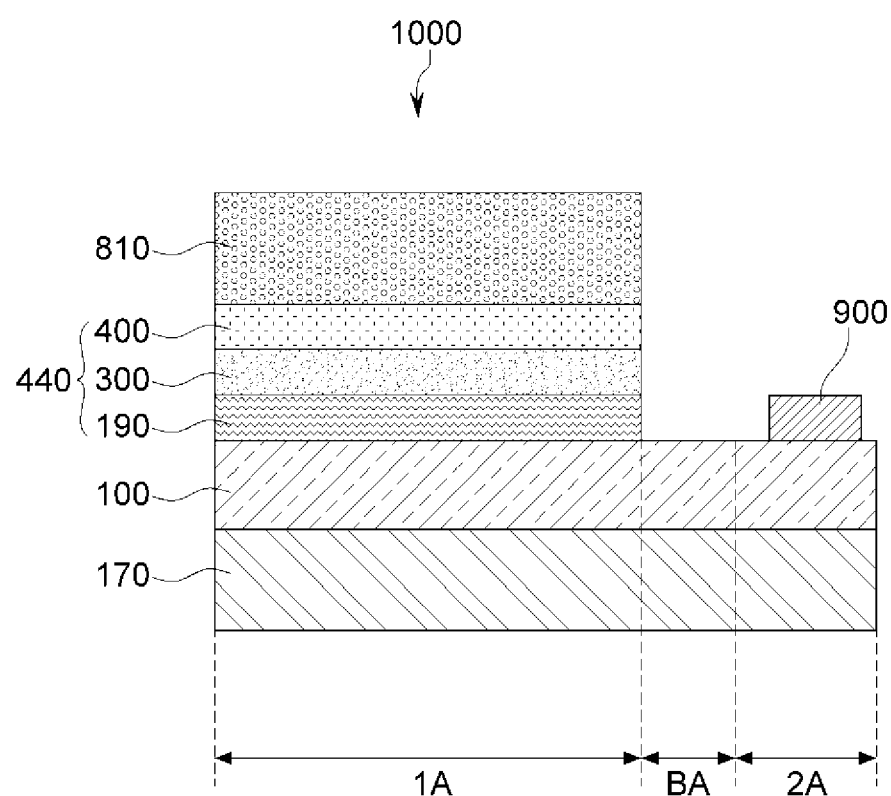

Next, as illustrated in FIG. 5G, the driving circuit portion 900 is disposed (e.g., formed or positioned) in the second area 2A of the substrate 100.

Figure 5H:
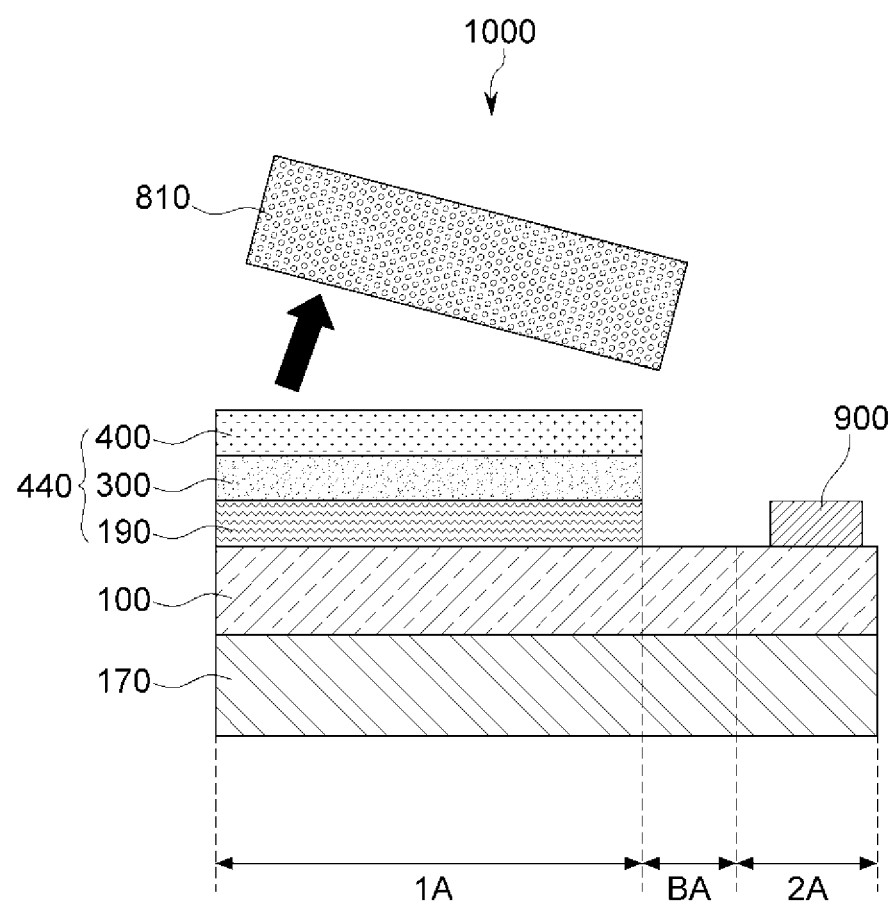

Then, as illustrated in FIG. 5H, the protective layer 810 disposed in the first area 1A is removed.

Figure 5I:
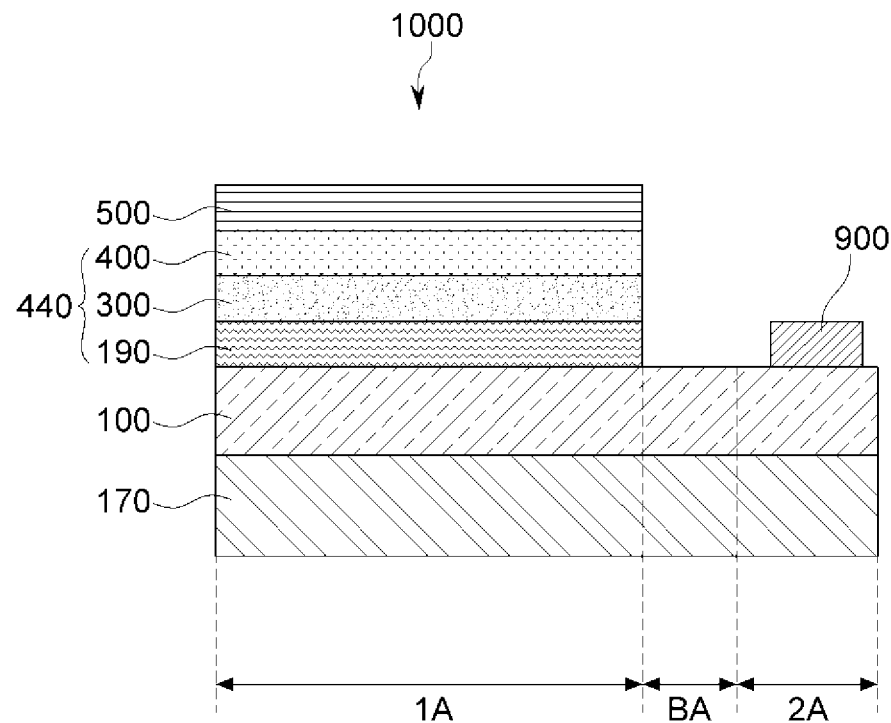

Next, as illustrated in FIG. 5I, the polarizing member 500 is disposed (e.g., formed or positioned) on the encapsulation layer 400.

Figure 5J:
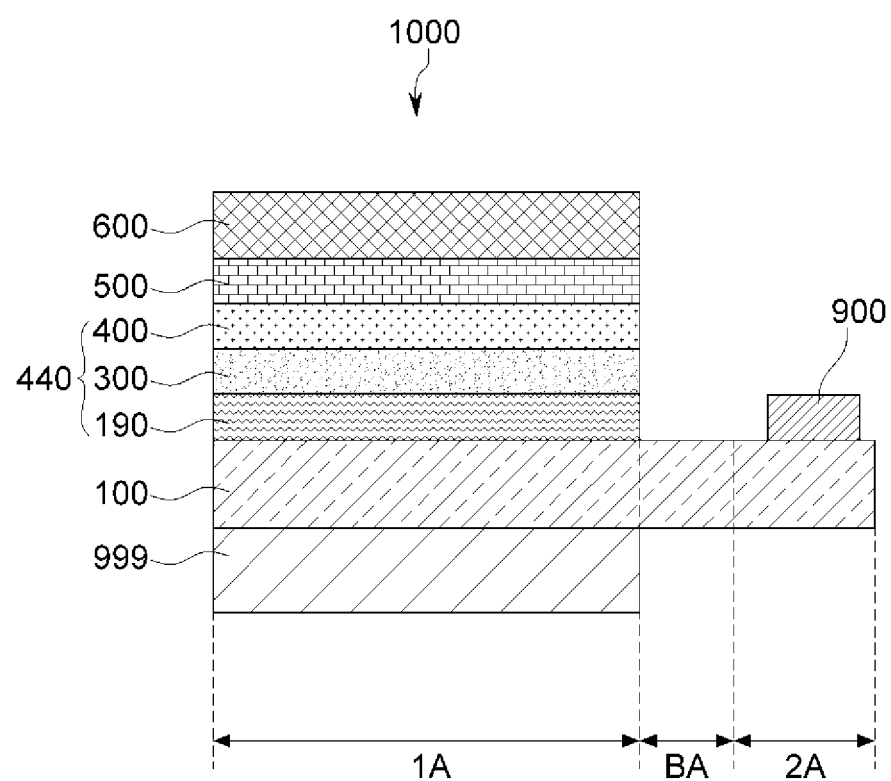

Next, as illustrated in FIG. 5J, the window 600 is disposed (e.g., formed or positioned) on the polarizing member 500. Subsequently, the module 999 is disposed (e.g., formed or positioned) on the lower surface of the protective layer 170. In some embodiments, the protective layer 170 and the module 999 may be attached to each other by an adhesive.

Figure 5K:
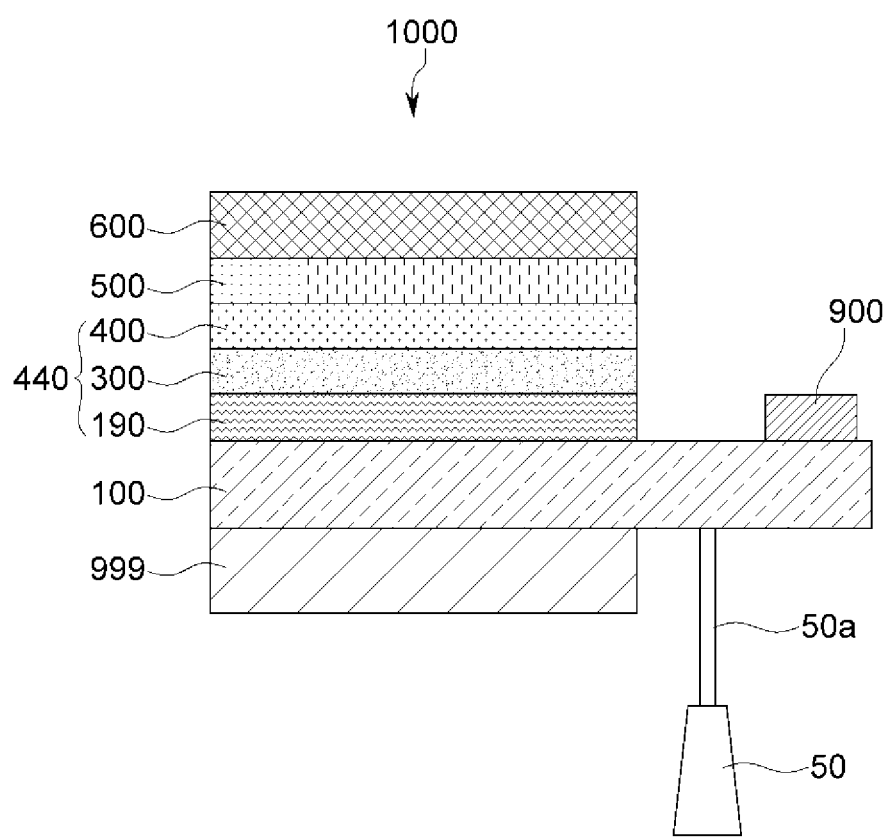

Next, as illustrated in FIG. 5K, the third protection portion 170*c* of the protective layer 170 is heated in a selective manner. To that end, for example, a laser beam 50*a* may be directed in a selective manner from a laser irradiation apparatus 50 to the third protection portion 170*c* of the protective layer 170. The material stiffness of the third protection portion 170*c* irradiated with the laser beam 50*a* may be lower than the material stiffness of the first protection portion 170*a* and/or the material stiffness of the second protection portion 170*b*. In some embodiments, the aforementioned step of laser irradiation may be omitted.

Next, as illustrated in FIG. 4, the display device 1000 may be bendable with respect to the third protection portion 170*c*. In some embodiments, since the material stiffness of the third protection portion 170*c* is relatively small (e.g., the flexibility of the third protection portion 170*c* is relatively high), the display device 1000 may be bent relatively easily. In addition, since the protective layer includes a photo-curable material and not a film, it is possible to omit, for example, the processes of removing a film (i.e., a lower protective layer) attached to a lower surface of a substrate, attaching a patterned film to the lower surface of the substrate, attaching a film carrier substrate to a lower surface of the patterned film, and removing the film carrier substrate. That is, the process may be simplified and associated manufacturing costs may be reduced.

As set forth hereinabove, according to one or more embodiments, display devices may be easily bent (e.g., a display device may be capable of easily being bent during manufacturing). In addition, a method of manufacturing a display device according to one or more embodiments may simplify manufacturing processes and reduce manufacturing costs.

Although example embodiments of the present disclosure have been described, it is understood that the present disclosure is not limited to these example embodiments, but various changes and modifications can be made by one of ordinary skill in the art within the spirit and scope of the present disclosure as hereinafter claimed.

Therefore, the disclosed subject matter is not be limited to any single embodiment described herein, and the above-described embodiments are to be considered illustrative and not restrictive. Accordingly, the scope of the present inventive concept shall be determined only according to the attached claims, and equivalents thereof.

What is claimed is:

1. A display device comprising:
a substrate comprising a bending area and a non-bending area;
a display element on an upper surface of the substrate;
a protective layer on a lower surface of the substrate and comprising a photo-curable material; and
a buffer layer between the substrate and the display element, the buffer layer having an opening overlapping the bending area,
wherein a portion of the protective layer in the bending area has a material stiffness lower than a material stiffness of a portion of the protective layer in the non-bending area, the portion of the protective layer in the non-bending area being a photo-cured portion and the portion of the protective layer in the bending area being an uncured portion.

2. The display device of claim 1, wherein the photo-curable material is a material that is curable by ultraviolet light.

3. The display device of claim 1, wherein, before the photo-curable material is cured, the photo-curable material maintains a solid state at room temperature, and wherein a material stiffness of the photo-curable material at a temperature ranging from about 50 degrees Celsius (° C.) to about 100° C. is lower than a material stiffness of the photo-curable material in the solid state at room temperature.

4. The display device of claim 2, wherein the photo-curable material comprises at least one of epoxy, acryl, and urethane.

5. The display device of claim 1, further comprising an encapsulation layer on the display element;
a polarizing member on the encapsulation layer; and
a window on the polarizing member.

6. The display device of claim 1, further comprising a module on a lower surface of the protective layer.

* * * * *